United States Patent
Freeman et al.

(10) Patent No.: US 7,308,008 B2
(45) Date of Patent: Dec. 11, 2007

(54) MAGNETICALLY CONTROLLED HEAT SINK

(75) Inventors: William R. Freeman, Castro Valley, CA (US); Hong Jin Jiang, Singapore (SG); Dallas Meyer, Danville, CA (US)

(73) Assignee: Finisar Corporation, Sunnyvale, CA (US)

( * ) Notice: Subject to any disclaimer, the term of this patent is extended or adjusted under 35 U.S.C. 154(b) by 274 days.

(21) Appl. No.: 10/705,620

(22) Filed: Nov. 10, 2003

(65) Prior Publication Data

US 2005/0169328 A1    Aug. 4, 2005

Related U.S. Application Data

(60) Provisional application No. 60/425,185, filed on Nov. 8, 2002.

(51) Int. Cl.
*H01S 3/04*    (2006.01)
*F25B 21/00*   (2006.01)
*F25B 21/02*   (2006.01)

(52) U.S. Cl. .......................... 372/36; 372/34; 372/35; 62/3.1; 62/3.2; 62/3.3

(58) Field of Classification Search ............. 372/34–36
See application file for complete search history.

(56) References Cited

U.S. PATENT DOCUMENTS

| | | | | | |
|---|---|---|---|---|---|
| 4,703,488 | A | * | 10/1987 | Di Vita et al. ............ | 372/44.01 |
| 5,022,756 | A | * | 6/1991 | Rhodes ........................ | 356/316 |
| 5,181,214 | A | * | 1/1993 | Berger et al. ................. | 372/34 |
| 6,055,815 | A | * | 5/2000 | Peterson ........................ | 62/3.7 |
| 6,483,784 | B1 | * | 11/2002 | Nakatani et al. .......... | 369/13.38 |
| 6,588,216 | B1 | * | 7/2003 | Ghoshal ........................ | 62/3.1 |
| 6,595,004 | B1 | * | 7/2003 | Ghoshal ........................ | 62/3.1 |
| 2001/0021207 | A1 | * | 9/2001 | Serizawa ..................... | 372/32 |
| 2003/0005706 | A1 | * | 1/2003 | Bell ............................... | 62/3.7 |
| 2003/0015768 | A1 | * | 1/2003 | Bosco et al. ................ | 257/528 |

FOREIGN PATENT DOCUMENTS

| JP | 52003406 A | * | 1/1977 |
|---|---|---|---|
| JP | 01081290 A | * | 3/1989 |
| JP | 03141663 A | * | 6/1991 |

* cited by examiner

*Primary Examiner*—Minsun Oh Harvey
*Assistant Examiner*—Phillip Nguyen
(74) *Attorney, Agent, or Firm*—Workman Nydegger

(57) ABSTRACT

A system and method for controlling the temperature of a heat-generating component such as a laser. A microelectromechanical system for controlling the temperature of the heat-generating component includes a magnetic heat sink device, a temperature sensor, and control circuitry. The temperature sensor detects the temperature of the heat-generating component through the heat sink and feeds the sensed temperature to the control circuitry. The detected temperature is compared to a predetermined temperature set point. When the detected temperature is higher than the temperature set point, a command is sent to the magnetic heat sink to take more heat out of the heat-generating component. When the detected temperature is lower than the temperature set point, a command is sent to the magnetic heat sink to take less heat out of the heat-generating component. One embodiment of a magnetic heat sink device includes a laser system, an actuator system, and a heat sink material disposed between the laser system and the actuator system.

18 Claims, 2 Drawing Sheets

MAGNETICALLY CONTROLLED HEAT SINK

This application claims priority to and the benefit of U.S. Provisional Patent Application Ser. No. 60/425,185, filed on Nov. 8, 2002, the disclosure of which is incorporated herein by reference.

BACKGROUND OF THE INVENTION

1. Field of the Invention

The present invention relates generally to controlling the temperature of a heat-generating component. In particular, the invention relates to controlling the temperature of a heat-generating component such as a laser that can tolerate operating slightly above ambient temperature.

2. Background Technology

When a component in a device such as a laser generates significant heat during operation, the extra heat can interfere with proper operation of the device. The extra heat, thus, needs to be removed and the component needs to be cooled or otherwise maintained at a constant temperature.

Currently, laser temperature is controlled with thermoelectric coolers (TECs). A major drawback with the TECs is that they require continuous and therefore usually considerable power compared to the power that is required by the component that generates heat (e.g., a laser diode). TECs generally consume, due to Joule heating, more power than is being pumped. Thus, the actual heat being pumped is more than twice the heat generated by the device being cooled. What is needed is a method and apparatus for precisely controlling the temperature of a heat-generating component while consuming significantly less power than the TECs.

SUMMARY OF THE INVENTION

The present invention is directed a system and method for controlling the temperature of a heat-generating component, such as a laser. The invention utilizes a microelectromechanical system, MEMS, for controlling the temperature of the heat-generating component. Such a system includes a magnetic heat sink device, a temperature sensor, and control circuitry. The temperature sensor detects the temperature of the heat-generating component through the heat sink device and feeds the sensed temperature to the control circuitry.

In a method for controlling the temperature of a heat-generating component, a magnetic heat sink device is provided having a temperature sensor. The temperature of the heat-generating component is detected through the temperature sensor. The detected temperature is then fed to control circuitry and is compared against a predetermined temperature set point. When the detected temperature is higher than the temperature set point, a command is sent to the magnetic heat sink device to take more heat out of the heat-generating component. When the detected temperature is lower than the temperature set point, a command is sent to the magnetic heat sink device to take less heat out of the heat-generating component.

One embodiment of a magnetic microelectromechanical heat sink device that can be used in the system of the invention includes a laser system comprising a laser mount having a first surface and an opposing second surface, with a laser diode coupled to the first surface of the laser mount. One or more magnetic plates are attached to the second surface of the laser mount. An actuator system is also provided that includes a plurality of actuator plates, and one or more magnetic components. A heat sink material is disposed between the laser system and the actuator system, with the heat sink material comprising one or more fingers. When the laser diode generates more heat than can be handled by the laser mount alone, the heat sink material attaches to the magnetic plates when a current flows through the actuator plates to provide additional heat sink volume.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE INVENTION

The present invention is directed to a system and method for controlling the temperature of a heat-generating component, such as a laser, and particularly to controlling the temperature of such a component that can tolerate operating slightly above ambient temperature. How much above ambient is determined by the thermal resistance of the heat spreader that the laser is attached to, the thermal resistance of the magnetic materials and the moving arms that provide additional thermal paths. The system and method disclosed herein drastically reduce power consumption by cooling the hot component passively and consuming power only when adapting to new temperature conditions. As used herein, the term "passively" means without active pumping of heat. It is important to realize that a thermoelectric cooler (TEC) is capable of controlling the temperature at a level below the ambient temperature. So the power saved by using the device of the invention is mostly due to the fact that it is controlling the flow of heat and not actively pumping the heat.

Figure 1:
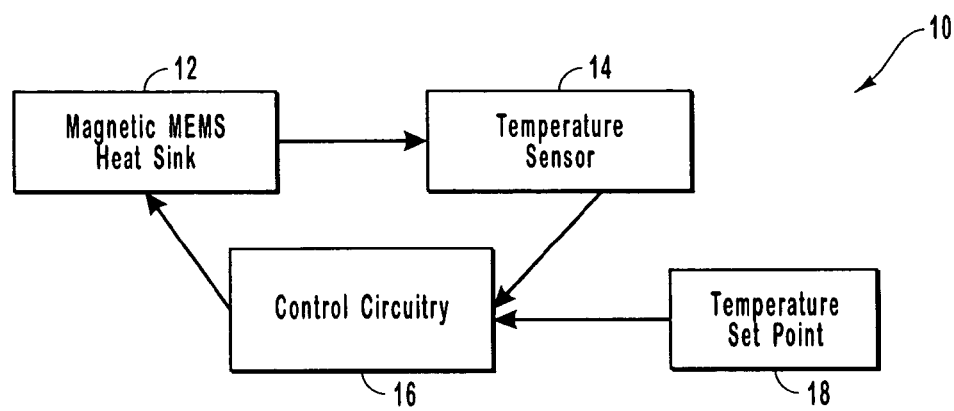
FIG. 1 depicts a block diagram of a magnetic microelectromechanical system in accordance with the invention.

Referring to the drawings, FIG. 1 depicts a block diagram of a magnetic microelectromechanical system (MEMS) 10 in accordance with the invention. Through the use of latching magnetic MEMS technology, the number of conductive paths for heat can be dynamically changed to keep the temperature at a constant value above the ambient temperature. As depicted, the magnetic MEMS 10 includes a magnetic MEMS heat sink 12, a temperature sensor 14, and control circuitry 16. The temperature sensor 14 senses the temperature of the device that is being cooled, such as a laser, and feeds the sensed temperature to the control circuitry 16. The control circuitry 16 may be electronic or molecular. The control circuitry 16, which includes a processor, compares the sensed temperature against a predetermined temperature set point 18. If the temperature of the sensor is higher than the temperature set point, the control circuitry sends a command to the magnetic MEMS heat sink 12 to take more heat out of the laser. For example, the control circuitry may send a command to the magnetic MEMS heat sink 12 to increase the contact area between the laser and the heat sink. On the other hand, if the sensed temperature is lower than the temperature set point, the control circuitry may send a command to the magnetic MEMS heat sink 12 to cut off or reduce the physical heat transfer path(s) between the laser and the heat sink.

Figure 2:
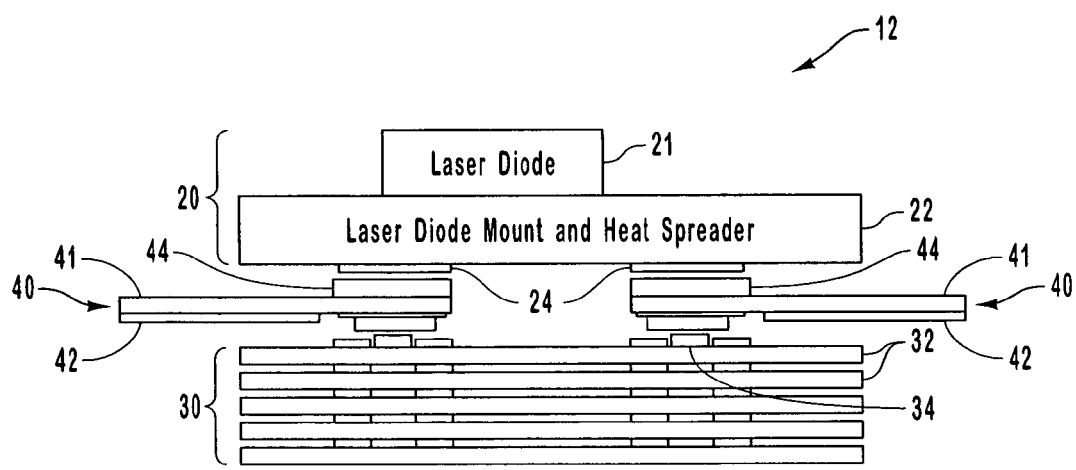
FIG. 2 is a schematic depiction of a magnetic heat sink according to one embodiment of the invention.

FIG. 2 depicts an embodiment of the magnetic MEMS heat sink 12 in more detail. The MEMS heat sink 12 includes a laser system 20, an actuator system 30, and a heat sink material 40. The laser system 20 includes a laser diode 21, which is the heat source, physically coupled to a laser mount 22. Heat generated by the laser diode 21 transfers to the laser mount 22, which is a well-known component that also acts as a heat spreader and a heat sink. The laser mount 22 can be made of materials including, but not limited to, silicon, brass, and a low coefficient of thermal expansion (CTE) lead frame alloy (e.g., alloys 42 or 410SS). Attached to at least one surface of the laser mount 22 is one or more magnetic plates 24. The magnetic plates 24 may be slabs of permanent magnet such as iron. When the laser diode 21 generates more heat than can be handled by the laser mount 22 alone, extra heat sink components (e.g., the heat sink material 40) attach to the magnetic plates 24 to provide additional heat sink volume.

Figure 3:
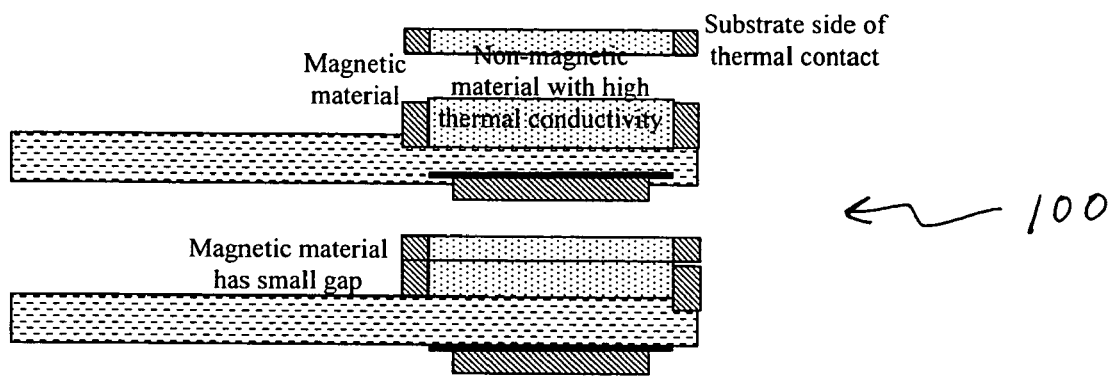
FIG. 3 is a schematic depiction of one design for the contacting surfaces of the magnetic heat sink of FIG. 2.

The actuator system 30 includes layers of actuator plates 32 that are preferably made of low temperature co-fired ceramics (LTCC). The actuator system 30 also includes an optional magnetic component 34 of the actuator, which is a permanent magnet for the purpose of latching the fingers in the off or no contact position without incurring a continuous power penalty. The main purpose of the magnetic component 34 is to make the whole system less sensitive to vibration. Surrounding magnetic component 34 are conductive traces embedded in the LTCC layers that are for the solenoids that push or pull the fingers. This action requires significant current but only for a very short time. The only moving parts in this embodiment of the invention are the fingers and there are no surfaces that slide against one another or otherwise can wear out. As actuators are well known, a person of ordinary skill in the art would understand how to build the actuator system 30. Since magnetic materials are rather poor thermal conductors, the design of the contacting surfaces important to the thermal transfer properties is illustrated in FIG. 3, designated generally at 100. There is a small gap when the contact is made between the substrate and thermal finger which assures that the high thermal conductivity surfaces meet first. It is not possible to make surfaces in this configuration meet perfectly except at one temperature because the CTEs of the materials differ, which means that their size changes with temperature and at different rates.

One or more fingers 41 are formed from the heat sink material 40 and are located between the laser system 20 and the actuator system 30. The fingers 41 are preferably made of silicon and coated with a heat-conducting material 42 such as copper, although the invention is not so limited. Although not shown in FIG. 2, the fingers 41 may be part of one wafer. Deposited on top of the fingers 41 is a permanent magnetic material 44 (e.g., SmCo) that makes the fingers 41 attach to the laser mount 22 when a certain amount of current flows through the plates of the actuator. When the fingers 41 contact the magnetic plates 24, the heat generated by the laser diode 20 transfers not only to the laser mount 22 but also to the fingers 41. The fingers 41 have sufficient flexibility to attach to the laser mount 22 or to the LTCC-based actuator plate 32. It is not necessary that the fingers attach to the LTCC-based actuator plate; all that is required is that the actuator can supply enough pull to dislodge the fingers from the laser mount. After being dislodged, the fingers can be free floating. However, the system is less vibration sensitive if the fingers do in fact attach to the actuator side. Since the heat dissipation is relatively proportional to the area of the contact, the incremental amount of additional heat sink volume that is achievable can be controlled both with the number of fingers 41 that are contacting the laser mount 22 and with the contact area per finger 41.

If the contact areas are in a binary sequence, then the number of fingers for a particular temperature resolution is a log base 2 of the range. The correct number (contact area) of contacts that can be engaged to maintain a given temperature is calculated by first determining the number of dissipation rate D. With this required number of dissipation rate D, the number of fingers (n) can be determined by using the equation $2^n = D$. For example, if the maximum temperature difference between the laser diode 20 and the preset temperature is 30° C. and the resolution needs to be at least 1C°, then D would have to be at least 30 (thirty). Since $2^5 = 32$ dissipation rates, five fingers would be needed.

If the temperature of the laser diode 20 is higher than a preset temperature, at least one finger 41 contacts the laser mount 22 at the magnetic plates 24, depending partly on how high the temperature is of laser diode 21. On the other hand, if the temperature of the laser diode is lower than the present temperature, then one or more fingers 41 are detached from the laser mount 22. With MEMS heat sink 12, power is consumed only when the fingers 41 are moved. Naturally, even when the laser diode 20 is being cooled because heat is transferring through the laser mount 22 and the fingers 41, no power is consumed because heat transfer occurs passively. Furthermore, MEMS heat sink 12 allows a highly reliable temperature control compared to currently used approaches like thermoelectric coolers (TECs).

Figure 4:
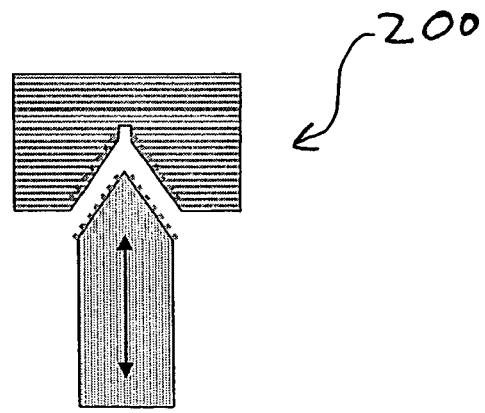
FIG. 4 is a schematic depiction of one design of a finger and magnetic contact for the magnetic heat sink of FIG. 2.

One of the problems previously noted is that the magnetic materials are generally not as conductive as the heat sink material. Another way of solving that problem is to increase the area of contact relative to the critical dimension of the finger. FIG. 4 is an illustration of one such implementation, designated generally at 200, although not in any way meant to be restrictive. The heavy dotted lines show the permanent magnetic surfaces. These surfaces are continuous relatively thin films. The pitch of the groove is such that it compensates by increasing the transfer area for the lower thermal conductivity of the magnetic material. Thus, this pitch will be a function of the thickness and thermal conductivity of the magnetic film. The arrow in FIG. 4 shows the direction of motion of the finger.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A microelectromechanical temperature control system, comprising:
   a magnetic MEMS heat sink device configured for thermal communication with a heat-generating component by way of a heat transfer path, the magnetic MEMS heat sink device including a heat sink having a volume;
   a temperature sensor responsive to input from the magnetic MEMS heat sink device; and
   control circuitry in communication with the temperature sensor and with the magnetic MEMS heat sink device, the control circuitry being responsive to input from the temperature sensor, and the heat sink volume and/or a heat transfer path geometry being variable in accordance with an output of the control circuitry.

2. The microelectromechanical temperature control system of claim 1, wherein the heat-generating component comprises a laser.

3. The microelectromechanical temperature control system of claim 2, wherein the laser comprises a laser diode.

4. The microelectromechanical temperature control system of claim 1, wherein the control circuitry comprises a processor.

5. The microelectromechanical temperature control system of claim 1, wherein the control circuitry compares a sensed temperature of the heat generating component against a predetermined temperature set point.

6. The microelectromechanical temperature control system of claim 3, wherein the magnetic MEMS heat sink device further comprises:
   a laser mount having a first surface and an opposing second surface;
   an actuator system comprising:
      a plurality of actuator plates; and
      one or more magnetic components; and
   the heat sink comprises;
      one or more magnetic plates attached to the second surface of the laser mount; and
      a heat sink material disposed between the laser mount and the actuator system, the heat sink material comprising one or more fingers;
   wherein the heat sink material attaches to the magnetic plates when a current flows through the actuator plates to provide additional heat sink volume.

7. The microelectromechanical temperature control system of claim 6, wherein the laser mount comprises a material selected from the group consisting of silicon, brass, and a low CTE lead frame alloy.

8. The microelectromechanical temperature control system of claim 6, wherein the magnetic plates comprise a permanent magnet.

9. The microelectromechanical temperature control system of claim 6, wherein the permanent magnet comprises iron.

10. The microelectromechanical temperature control system of claim 6, wherein the actuator plates comprise a low temperature co-fired ceramic material.

11. The microelectromechanical temperature control system of claim 6, wherein the fingers comprise silicon coated with a heat-conducting material.

12. The microelectromechanical temperature control system of claim 11, wherein the heat-conducting material comprises copper.

13. The microelectromechanical temperature control system of claim 6, wherein the fingers are part of a silicon wafer.

14. The microelectromechanical temperature control system of claim 6, further comprising a permanent magnetic material on a portion of the one or more fingers.

15. The microelectromechanical temperature control system of claim 14, wherein the permanent magnetic material comprises SmCo.

16. The microelectromechanical temperature control system of claim 6, wherein the heat sink material attaches to the magnetic plates when a current flows through the actuator plates to provide additional heat sink volume when a laser diode in thermal communication with the laser mount generates more heat than can be handled by the laser mount alone.

17. The microelectromechanical temperature control system of claim 1, wherein physical heat transfer between the heat-generating component and the heat sink device is varied at least in part based on the sensed temperature.

18. The microelectromechanical temperature control system of claim 1, wherein the physical heat transfer between the heat-generating component and the heat sink device is varied by varying a contact area between the heat sink device and the heat-generating component.

* * * * *

UNITED STATES PATENT AND TRADEMARK OFFICE
CERTIFICATE OF CORRECTION

PATENT NO. : 7,308,008 B2  Page 1 of 1
APPLICATION NO. : 10/705620
DATED : December 11, 2007
INVENTOR(S) : Freeman et al.

It is certified that error appears in the above-identified patent and that said Letters Patent is hereby corrected as shown below:

Column 4
Line 2, change "the laser diode 20" to --the laser diode 21--
Line 25, change "the laser diode 20" to --the laser diode 21--
Line 30, change "the laser diode 20" to --the laser diode 21--
Line 34, change "the laser diode" to --the laser diode 21--
Line 38, change "the laser diode 20" to --the laser diode 21--

Column 6
Line 7, change "system of claim 6" to --system of claim 8--

Signed and Sealed this

Nineteenth Day of October, 2010

David J. Kappos
*Director of the United States Patent and Trademark Office*